United States Patent [19]

Ogawa et al.

[11] Patent Number: 5,379,263
[45] Date of Patent: Jan. 3, 1995

[54] SEMICONDUCTOR MEMORY DEVICE WHICH CAN PROVIDE REQUIRED DATA FLEXIBLY UNDER SIMPLIFIED CONTROL AND OPERATING METHOD THEREFOR

[75] Inventors: Toshiyuki Ogawa; Masahiko Ishikawa, both of Hyogo, Japan

[73] Assignee: Mitsubishi Denki Kabushiki Kaisha, Tokyo, Japan

[21] Appl. No.: 35,926

[22] Filed: Mar. 23, 1993

[30] Foreign Application Priority Data

Mar. 24, 1992 [JP] Japan .................................. 4-066054

[51] Int. Cl.⁶ ................................................ G11C 7/00
[52] U.S. Cl. ........................ 365/230.04; 365/189.02; 365/219; 365/230.03; 365/230.09
[58] Field of Search ....................... 365/239, 240, 230.5, 365/230.9, 221, 219, 189.02, 230.4, 230.04, 230.03

[56] References Cited

U.S. PATENT DOCUMENTS

| | | | |
|---|---|---|---|
| 4,644,502 | 2/1987 | Kawashima | 365/219 |
| 4,747,081 | 5/1988 | Heilveil | 365/219 |
| 4,849,937 | 7/1989 | Yoshimoto | 365/230.04 X |
| 4,855,959 | 8/1989 | Kobayashi | 365/239 |
| 5,040,149 | 8/1991 | Ebihara | 365/230.04 X |
| 5,121,360 | 6/1992 | West | 365/230.04 X |
| 5,200,925 | 4/1993 | Morooka | 365/230.03 X |
| 5,247,484 | 9/1993 | Watanabe | 365/230.5 |

Primary Examiner—Eugene R. LaRoche
Assistant Examiner—Son Mai
Attorney, Agent, or Firm—Lowe, Price, LeBlanc & Becker

[57] ABSTRACT

An improved video RAM having two data registers for holding data of each row in a memory cell array 1. A transfer gate circuit transfers alternately data of each row of the memory cell array 1 to the two data registers. On the other hand, since a switching circuit selects data held in the two data registers alternately and provide the same serially. In addition, length of data to be provided can be controlled externally. When a special high speed data reading such as oblique reading is required, timing control of externally applied control signals can be simplified.

13 Claims, 18 Drawing Sheets

SEMICONDUCTOR MEMORY DEVICE WHICH CAN PROVIDE REQUIRED DATA FLEXIBLY UNDER SIMPLIFIED CONTROL AND OPERATING METHOD THEREFOR

BACKGROUND OF THE INVENTION

1. Field of the Invention

The present invention relates generally to semiconductor memory devices, and more particularly, to a semiconductor memory device which can provide required data flexibly under simplified control. The present invention has particular applicability to video random access memories (VRAMs).

2. Description of the Background Art

With recent use of semiconductor memories in various electronic equipment, various functions have become necessary. More specifically, although a semiconductor memory basically has a function of storing applied (or predetermined) data and reading the stored data, an additional function of access has become necessary. In particular, to carry out video signal processing or image signal processing at a high speed, serial access, that is, serial reading and/or serial writing of data signals, has become necessary.

As a random access memory (RAM) having a serial access function, a video RAM and a field memory, for example, are known. The video RAM has a random access port and a serial access port. An applied data signal is stored in an externally designated memory cell through the random access port, and the stored data signal is read out from the externally designated memory cell. On the other hand, the data signal applied through the serial access port is serially stored in an externally designated memory cell row, and the stored data signal is serially read out from the externally designated memory cell row. In order to carry out image signal processing at a high speed, the random access port is frequently used, while the serial access port is used for supplying processed, that is, stored pixel signals to an image indication device such as CRT at a high speed.

Although the present invention is generally applicable to a semiconductor memory having a serial access function, for simplicity of description, an example where the present invention is applied to the video RAM will be described hereinafter.

FIG. 13 is a block diagram of the video RAM showing the background of the present invention. Referring to FIG. 13, a video RAM 600 includes a memory cell array 1 provided with a multitude of memory cells (not shown) arranged in rows and columns, a row decoder 5 for selecting a memory cell row in response to an externally applied row address signal, a column decoder 6 for selecting a memory cell column in response to an externally applied column address signal, and a sense amplifier 2 for amplifying a data signal read out from the memory cell array 1. A row address buffer 4a applies row address signals included in externally applied address signals A0 to An to the row decoder 5. A column address buffer 4b applies column address signals included in address signals A0 to An to the column decoder 6.

A random access operation is carried out as in the following. In the reading operation, a data signal stored in a memory cell in a row selected by the row decoder 5 is amplified by the sense amplifier 2. The column decoder 6 selects one column through an IO gate circuit 3, and the amplified data signal of the selected column is applied to a preamplifier 7a. The data signal amplified by the preamplifier 7a is provided through a main amplifier 7b as output data DQ.

In the writing operation, the input data DQ is applied to a DIN buffer (data in buffer) 7c. A write circuit 7d amplifies an input data signal to apply the amplified signal to the memory cell array 1 through the IO gate circuit 3. The column decoder 6 selects one column through the IO gate circuit 3, and the row decoder 5 selects one memory cell row. Therefore, the input data signal is stored in the memory cell designated by the row decoder 5 and the column decoder 6.

The serial access operation is carried out as in the following. In the reading operation, the row decoder 5 selects one memory cell row, and the data signal stored in the memory cell in the selected row is amplified by the sense amplifier 2. Since a transfer gate circuit 11 is turned on in response to a transfer control signal $\Phi r$ generated from a timing control circuit 44, the data signal in one selected row is applied to a data register 12. A serial counter 13 sequentially selects data held in the data register 12 in response to an output signal from a serial counter 100. Therefore, the stored data signal is provided as serial output data SQ after amplification by a preamplifier 14a and a main amplifier 14b.

The timing control circuit 44 receives various externally applied control signals /RAS, /CAS, /DT, /OE, /WB, /WE and /SE and a serial clock signal SC. The signal /RAS corresponds to a row address strobe signal. The signal /CAS corresponds to a column address strobe signal. The timing control circuit 44 provides a clock signal $\Phi sc$ for driving the serial counter 100 in response to the serial clock signal SC. In addition to this, the timing control circuit 44 provides the transfer control signal $\Phi r$ in response to the signal /RAS serving as a state control signal.

FIG. 14 is a timing chart for explaining the serial reading operation of the video RAM shown in FIG. 13. Referring to FIG. 14, since the signal /RAS falls when the signal /DT is at a low level, a transfer cycle TC1 is initiated.

The externally applied address signals A0 to An include a row address signal denoting a row R1 and column address signal denoting a column I. When the transfer cycle TC1 is initiated, the row address signal R1 is stored in the row address buffer 4a. The row decoder 5 selects one row in the memory cell array 1 by decoding the stored row address signal R1. The data signal stored in the memory cell of the selected row is amplified by the sense amplifier 2.

After the signal /CAS falls, the column address signal I is stored in the column address buffer 4b. Since the transfer gate circuit 11 is turned on in response to the transfer control signal $\Phi r$ after the rise of the signal /DT, the data signal amplified by the sense amplifier 2 is transferred to the data register 12 to be stored therein. Simultaneously, the column address signal I stored in the column address buffer 4b is applied to the serial counter 100 as an initial value. The serial counter 100 starts counting to apply an output signal to the serial selector 13 in response to the clock signal $\Phi sc$ applied from the timing control circuit 44.

The serial selector 13 sequentially selects data from one row of data signals stored in the data register 12 starting from the data designated by the column address signal I. The selected data is sequentially provided as the serial output data SQ after amplification by the preamplifier 14a and the main amplifier 14b. The result is that, in response to the serial clock signal SC, the Ith data and et seq. of the data stored in the selected row R1 of the memory cell array 1 are provided as the serial output data SQ.

Similarly, operations in the next transfer cycle TC2 are also continued. In the transfer cycle TC2, data stored in a row R2 of the memory cell array 1 is transferred to the data register 12, and the Jth data and et seq. are serially read out.

In a period between the transfer cycles TC1 and TC2, the serial data output is carried out as described before, while an asynchronous random access operation can be carried out independently of the serial reading operation. In other words, since the transfer gate circuit 11 is off in this period, random access can be carried out through a random access port DQ.

FIG. 15 is a memory matrix diagram for explaining a concept of oblique reading in the video RAM. The memory matrix shown in FIG. 15 corresponds to part of one screen in the image indication. In other words, each element constituting the memory matrix corresponds to each of pixel signals p0 to p7, p10 to p17, . . . and the like constituting one screen.

In access to the video RAM, the "oblique reading" shown in FIG. 15 is sometimes required. In the oblique reading, after, eight pixel data p0 to p7 stored in the row R1 in the memory cell array, for example, are read out, eight pixel signals p10 to p17 stored in the next row R2 are read out. Since the similar reading is also required in other rows, the oblique reading is carried out. The oblique reading as shown in FIG. 15 is utilized in, for example, the following image processing.

FIG. 16(a) shows a memory matrix storing pixel signals for indicating image "A". Data stored in the memory matrix is sequentially read out along each row, whereby the image shown in FIG. 16(b) can be obtained by the read data. Therefore, FIGS. 16(a) and (b) show an example of ordinary horizontal reading.

In the oblique reading, as shown in FIG. 16(c), data stored in the memory matrix is sequentially read out in the oblique direction. The image shown in FIG. 16(d) can be obtained by using the read data. As can be seen from comparison between FIGS. 16(b) and (d), a rotated image can be obtained by carrying out the oblique reading. More specifically, the oblique reading is useful for rotation processing in image processing, as one example. The oblique reading shown in FIG. 16(c) can be implemented as shown in, for example, FIG. 15.

As described above, although the oblique reading is useful in image processing, there is a problem that timing control of externally applied control signals is difficult. In other words, referring to FIG. 14, when the row R1 where the serial reading is carried out is changed to the next new row R2, synchronization of the control signal /DT and the serial clock signal SC is required, and the synchronization control is difficult. It is pointed out that timing control is particularly difficult in image processing where high speed processing is required.

FIG. 17 is a block diagram of another video RAM showing the background of the present invention. A video RAM 700 shown in FIG. 17 has a "split function". Description on the "split function" is given in, for example, the U.S. Pat. No. 4,855,959. A semiconductor memory having the split function is provided with a data register holding upper bit data and a data register holding lower bit data of data stored in one row of a memory cell array. Transfer of data is carried out from the memory cell array to one of the two data registers, while the serial data is provided from the other of the data registers. Transfer and serial output of data from the two data registers are carried out alternately.

Referring to FIG. 17, the video RAM 700 includes divided transfer gate circuits 11a, 11b, divided data registers 12a, 12b, and divided serial selectors 13a, 13b for implementing the split function. The address buffer 4 includes a row address buffer and a column address buffer. The transfer gate circuits 11a and 11b operate in response to a control signal applied from the transfer control circuit 10.

A serial selector control circuit 53 for controlling the serial selectors 13a and 13b includes an address pointer 16, a serial counter 17, switching circuits 31 and 32, and a finally determining circuit 40. A timing control circuit 45 provides control signals DSF, ATWL, SPWL and SPL for controlling various operations in the video RAM 700.

FIG. 18 is a timing chart for explaining operations in the transfer cycle of the video RAM shown in FIG. 17. Referring to FIGS. 17 and 18, operations in the transfer cycle will now be described. After the signal /DT falls, in response to the fall of the signal /RAS, the transfer cycle is initiated, whereby input/output through the random access port is inhibited. After the data signal stored in the row selected by the row decoder 5 is amplified by the sense amplifier 2, the transfer gate circuits 11a and 11b are turned on in response to the rise of the signal /DT. Therefore, data of one row is applied to the data registers 12a and 12b to be stored therein. On the other hand, a column address signal I indicating an initial address in the serial reading is externally applied through the address buffer 4. The column address signal I is applied to the address pointer 16 through the switching circuit 31, and transferred to the serial counter 17 through the switching circuit 32.

The serial counter 17 initiates a counting operation from an initial address I in response to a clock signal SC applied from the timing control circuit 45. The serial selectors 13a and 13b sequentially select data held in the data registers 12a and 12b starting from the Ith data in response to an output signal from the serial counter 17. Therefore, the Ith data and et seq. of the data in the row R1 are sequentially provided as serial output data SQ. It is pointed out that reading and writing of data through the random access port can be implemented asynchronously while the serial output of the data is carried out.

FIG. 19 is a timing chart for explaining operations of the split function of the video RAM shown in FIG. 17. Referring to FIG. 19, initial transfer is carried out by using a normal transfer mode in a period T30. Therefore, data of the row R1 selected by the row decoder 5 is transferred to the data registers 12a and 12b through the transfer gate circuits 11a and 11b. In addition to this, the column address signal I indicative of the initial address is also applied to the serial counter 17 in response to the pulse signals ATWL and SPWL.

The split transfer is carried out in a period T31. In this period, since the serial counter 17 provides a low level signal QSF, the latter half of the data stored in a row selected by the row decoder 5 is transferred to the data register 12b through the transfer gate circuit 11b. On the other hand, in this period, the Ith data and et seq. of the data held in the data register 12a are provided outside as the serial output data SQ in response to the serial clock signal SC. In this period T31, furthermore, the row address signal R1 and a column address signal J for the split transfer in the next period T32 are applied to the address buffer 4. The column address signal J is used as the initial address in the next split transfer period T32. In response to the pulse signal ATWL, and stored therein the column address signal J is applied to the address pointer 16 through the switching circuit 31, and stored therein.

In the period T32, the next split transfer is carried out. In this period T32, since a high level signal QSF is provided from the serial counter 17, the former half of the data of the row R1 designated in the previous period T31 is applied to the data register 12a through the transfer gate circuit 11a. The Jth data and et seq. of the data stored in the data register 12b are sequentially provided outside in response to the serial clock signal SC.

It is pointed out that random access through the random access port, that is, random reading and random writing, can be carried out in periods T41 and T42 shown in FIG. 19.

FIG. 11 is a concept diagram showing input/output of the data registers 12a and 12b in the split transfer shown in FIG. 19. Referring to FIG. 11, in the initial transfer period T30, the row address signal R1 and the column address signal I (not shown) for the split transfer in the next period T31 are applied. In the period T31, the Ith data and et seq. of the data stored in the data register 12a are provided through the serial input/output buffer 14. In this period T31, the data in the row R1 is transferred to the data register 12b.

In the next split transfer period T32, data of the row R2 is transferred to the data register 12a. In this period T32, the Jth data and et seq. of the data stored in the data register 12b are provided.

Furthermore, in a period T33, the Kth data and et seq. of the data stored in the data register 12a are provided, while data of the next new row is transferred to the data register 12b.

As can be seen from FIG. 11, although column addresses I, J, K, . . . , and the like of the first data to be provided of the data stored in the data registers 12a and 12b are externally designated, the last address to be provided of each of the registers 12a and 12b can not be externally designated. Therefore, for example, in the period T31, all of the Ith data and et seq. of the data stored in the data register 12a are read out regardless of necessity.

Referring to FIG. 20, it is assumed that pixel data for indicating areas AR1 and AR2 in the screen SCR is required. For facility of understanding, the screen SCR can be considered to correspond to a memory cell array in the video RAM. In such a case, the video RAM 700 shown in FIG. 17 provides the pixel data shown in FIG. 21 since it carries out the split transfer shown in FIG. 11.

Referring to FIG. 21, the video RAM 700 provides pixel data for indicating areas AR3 and AR4 on the screen SCR. In other words, since the video RAM 700 provides data which is not actually required, the operation time is consumed for unnecessary access.

As described above, the video RAM 600 shown in FIG. 13 requires synchronization of the signal /DT and the serial clock signal SC in order to carry out the oblique reading, thereby suffering from a difficulty in synchronous control under requirement of a high speed operation.

In addition to this, as can be seen from comparison of FIGS. 20 and 21, the video RAM 700 shown in FIG. 17 consumes access time for providing unnecessary data, thereby posing a problem that the high speed operation in image processing is hampered.

SUMMARY OF THE INVENTION

One object of the present invention is to simplify timing control of externally applied timing control signals required in the high speed reading of a semiconductor memory device.

Another object of the present invention is to provide a semiconductor memory device capable of providing serially only necessary data and suitable for a high speed operation.

Still another object of the present invention is to simplify timing control of externally applied timing control signals required in the high speed reading of a video random access memory device.

A further object of the present invention is to provide a video random access memory device capable of providing serially only necessary data and suitable for a high speed operation.

Briefly, the semiconductor memory device according to the present invention includes a memory cell array including a plurality of memory cells arranged in rows and columns, first and second data holding circuits each holding data stored in one row in the memory cell array, an alternate data transfer circuit for alternately transferring data stored in the rows of the memory cell array to the first and the second data holding circuits in response to an externally applied state control signal, and an alternate data output circuit for alternately providing data held in the first and the second data holding circuits in response to an externally applied serial clock signal.

In operation, data from the memory cell array are alternately transferred to the first and the second data holding circuits. The transferred data are held in the first and the second data holding circuits to be provided alternately. In this way, since the alternate data transfer circuit and the alternate data output circuit which operate in response to the externally applied signals are provided, it is possible to simplify timing control of timing control signals required to provide only necessary data.

According to another aspect of the present invention, the semiconductor memory device includes a memory cell array including a plurality of memory cells arranged in rows and columns, a data holding circuit for holding data stored in one row in the memory cell array in response to an externally applied state control signal, an initial address holding circuit for holding an externally applied initial address, an end address holding circuit for holding an externally applied end address, and a data output circuit for providing data defined by the initial address and the end address serially from the data holding circuit in response to an externally applied serial clock signal.

In operation, since the end address holding circuit is provided in addition to the initial address holding circuit, necessary data, that is, desired data defined by the initial address and the end address can be provided. Therefore, access time is not consumed for providing unnecessary data, whereby a high speed operation can be achieved.

According to still another aspect of the present invention, a method of operating the semiconductor memory device including a memory cell array having a plurality of memory cells arranged in rows and columns, and first and second data holding circuits each holding data stored in one row in the memory cell array includes the step of alternately transferring data stored in the rows of the memory cell array to the first and the second data holding circuits in response to an externally applied state control signal, and the step of alternately providing data stored in the first and the second data holding circuits in response to an externally applied serial clock signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
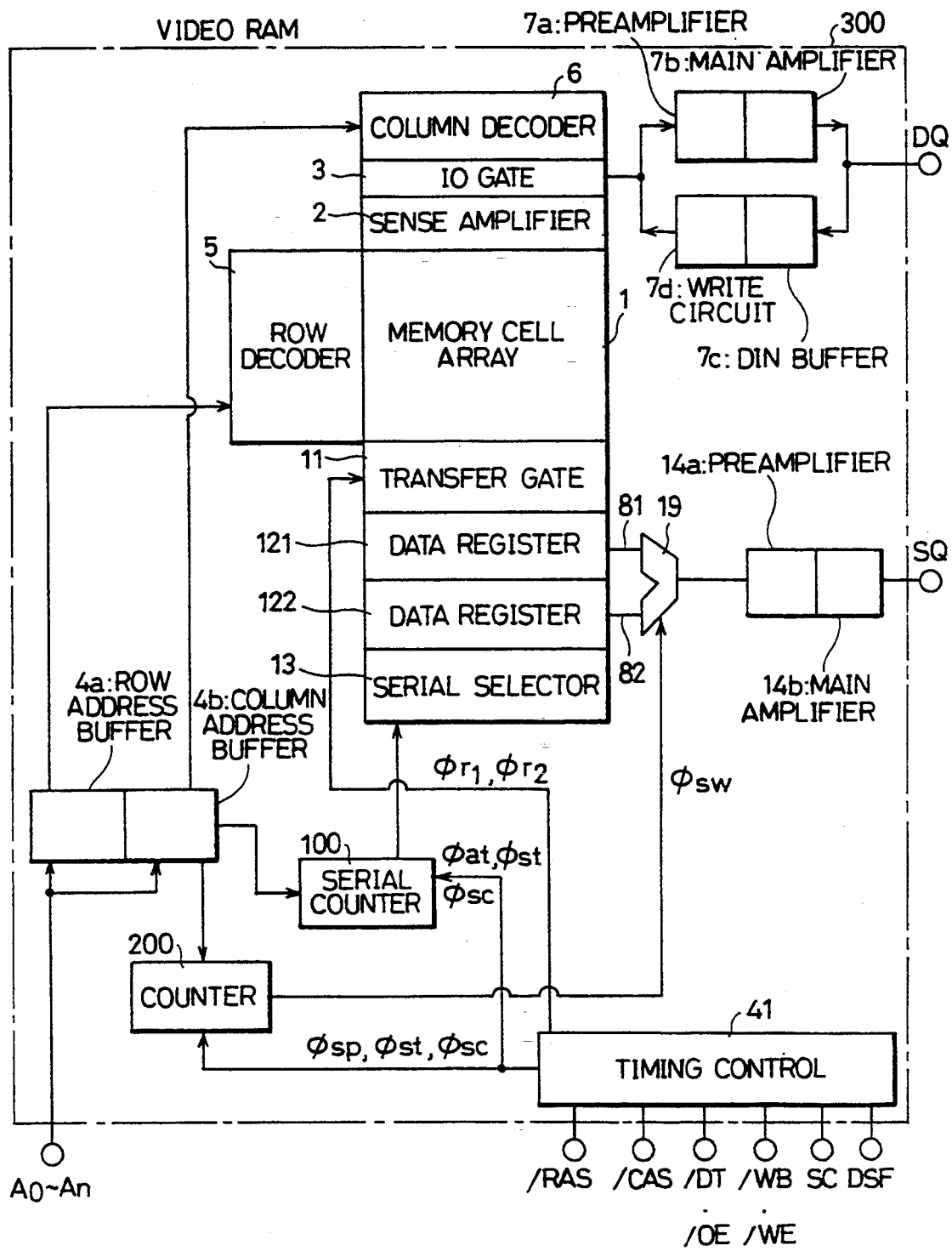
FIG. 1 is a block diagram of a video RAM showing one embodiment of the present invention.
Figure 13:
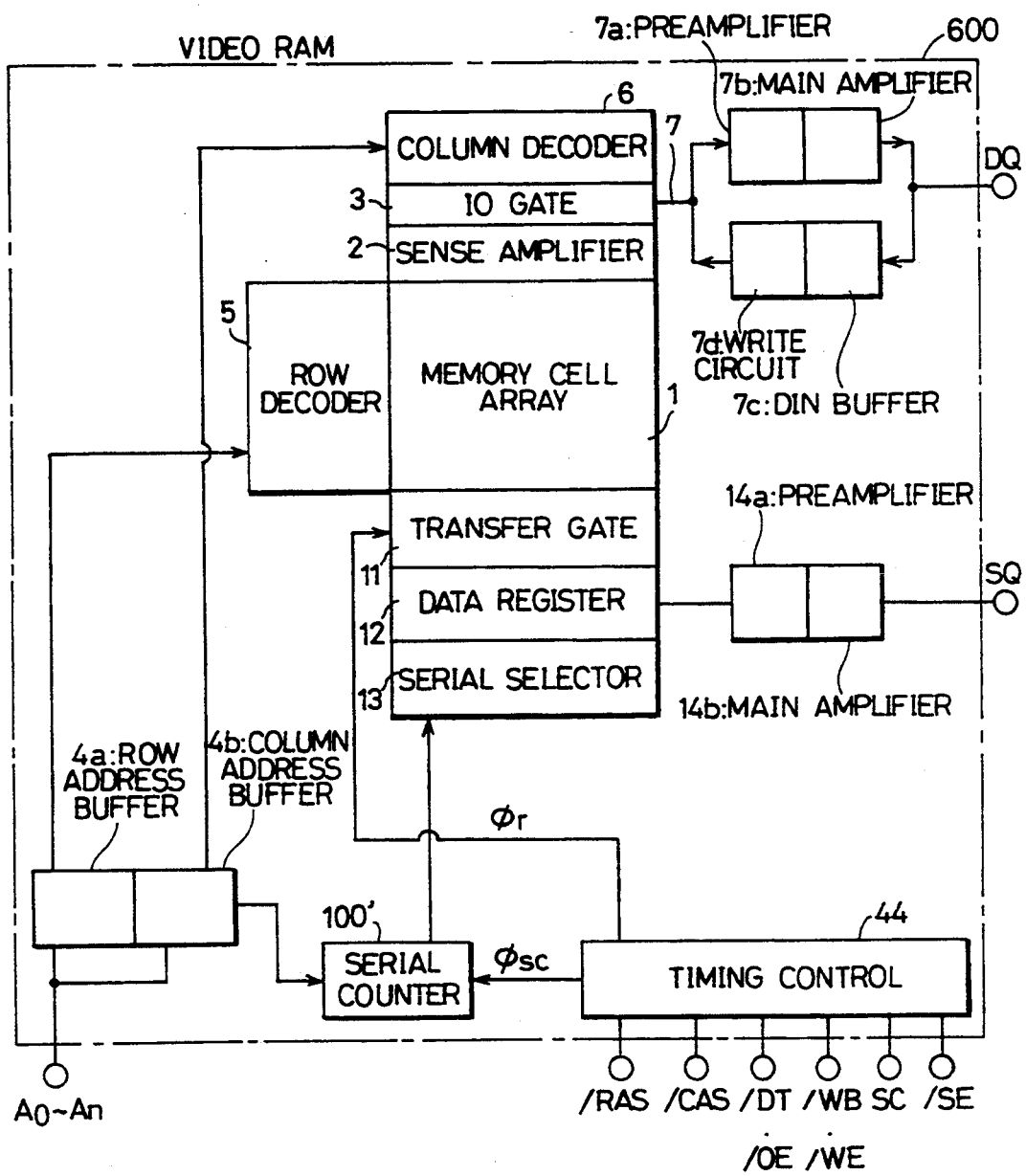
FIG. 13 is a block diagram of the video RAM showing the background of the present invention.
Figure 14:
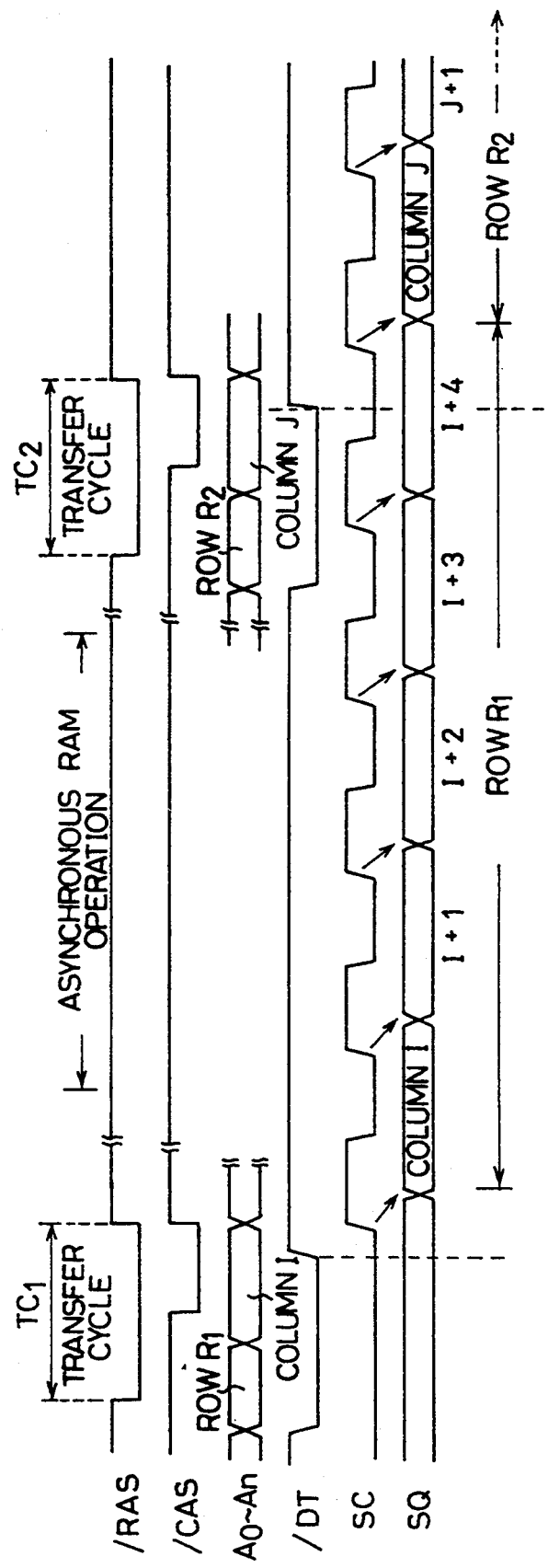
FIG. 14 is a timing chart for explaining a serial reading operation of the video RAM shown in FIG. 13.

Referring to FIG. 1, a video RAM 300, as compared to a video RAM 600 shown in FIG. 13, includes an improved transfer gate circuit 11, two data registers 121 and 122, and a switching circuit 19 connected to outputs of the data registers 121 and 122. The transfer gate circuit 11 operates in response to transfer control signals $\Phi r1$ and $\Phi r2$ provided from a timing control circuit 41. The switching circuit 19 is controlled in response to a switching control signal $\Phi sw$ provided from the counter 200. The timing control circuit 41 applies control signals $\Phi at$, $\Phi st$ and $\Phi sc$ to the serial counter 100. The timing control circuit 41 applies control signals $\Phi sp$, $\Phi st$ and $\Phi sc$ to the counter circuit 200. Since the other circuit configuration is similar to that of the video RAM 600 shown in FIG. 13, description will not be repeated.

Figure 2:
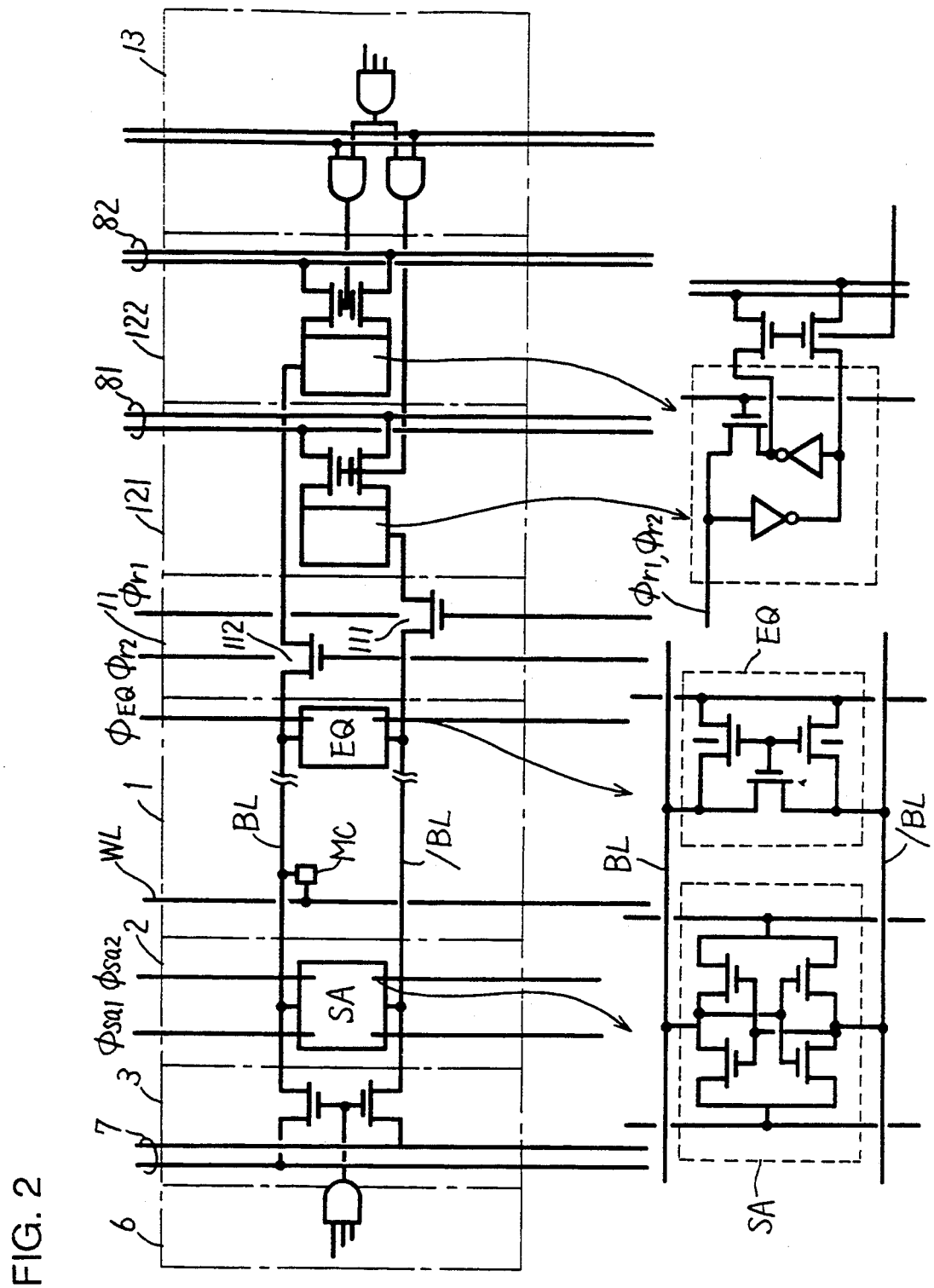
FIG. 2 is a schematic diagram of main circuits in the video RAM shown in FIG. 1.

FIG. 2 is a schematic diagram of main circuits in the video RAM 300 shown in FIG. 1. Although FIG. 2 shows only circuits relating to one column of the memory cell array 1, the similar circuits are provided for the other columns.

Referring to FIG. 2, the memory cell array 1 includes a memory cell MC connected to a bit line BL and a word line WL, and an equalizing circuit EQ connected between bit lines BL and /BL. The equalizing circuit EQ equalizes a bit line pair BL, /BL in response to an equalization control signal $\Phi_{EQ}$. The sense amplifier circuit 2 includes a sense amplifier SA activated in response to activation signals $\Phi sa1$ and $\Phi sa2$. The sense amplifier SA amplifies a slight potential difference which appears between the bit lines BL, /BL.

The IO gate circuit 3 includes two NMOS transistors which are turned on in response to a column select signal provided from the column decoder 6. When the IO gate circuit 3 is turned on, a data signal amplified by the sense amplifier SA is transferred to the preamplifier 7a through an IO line pair 7.

The transfer gate circuit 11 includes an NMOS transistor 112 connected to the bit line BL, and an NMOS transistor 111 connected to the bit line /BL. The transistors 111 and 112 are turned on in response to the transfer control signals $\Phi r1$ and $\Phi r2$, respectively, applied from the timing control circuit 41. Each of the data registers 121 and 122 has the same circuit configuration as shown in FIG. 2. The data register 121 is connected to the switching circuit 19 shown in FIG. 1 through an output signal line 81. The data register 122 is connected to the switching circuit 19 through an output signal line 82. The serial selector 13 selects the data registers 121 and 122 in response to an output signal provided from the serial counter 100.

Figure 3:
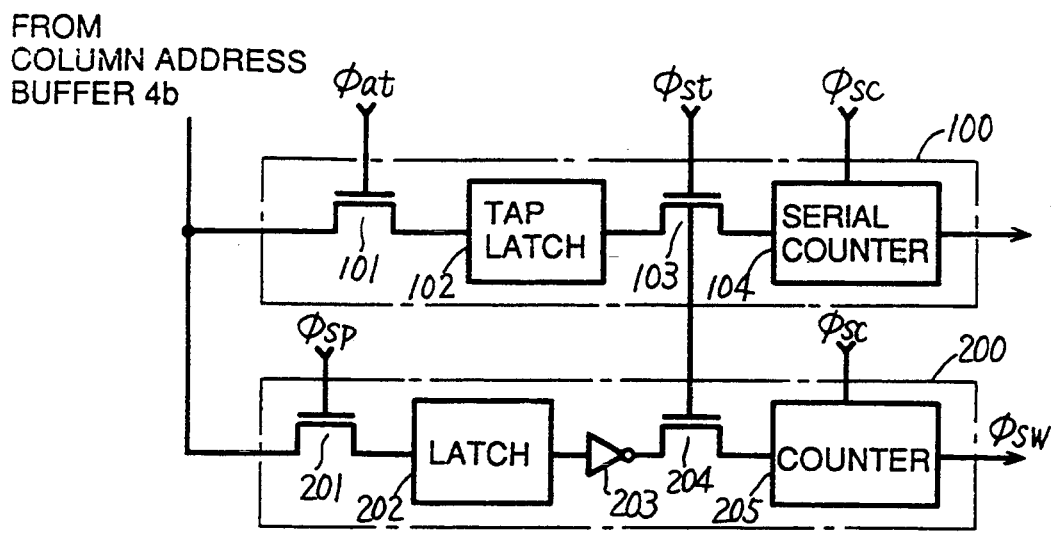
FIG. 3 is a circuit block diagram of counter circuit 100 and 200 shown in FIG. 1.

FIG. 3 is a circuit block diagram of the counter circuits 100 and 200 shown in FIG. 1. Referring to FIG. 3, the serial counter circuit 100 includes a switching circuit 101 operating in response to the signal $\Phi at$, a top address pointer latch circuit (hereinafter referred to as a "TAP latch circuit") 102, a switching circuit 103 operating in response to the signal $\Phi st$, and a serial counter 104 driven in response to the signal $\Phi sc$. The counter circuit 200 includes a switching circuit 201 operating in response to the signal $\Phi sp$, a latch circuit 202, an inverter circuit 203, a switching circuit 204 operating in response to the signal $\Phi st$, and a counter 205 driven by the signal $\Phi sc$.

Figure 15:
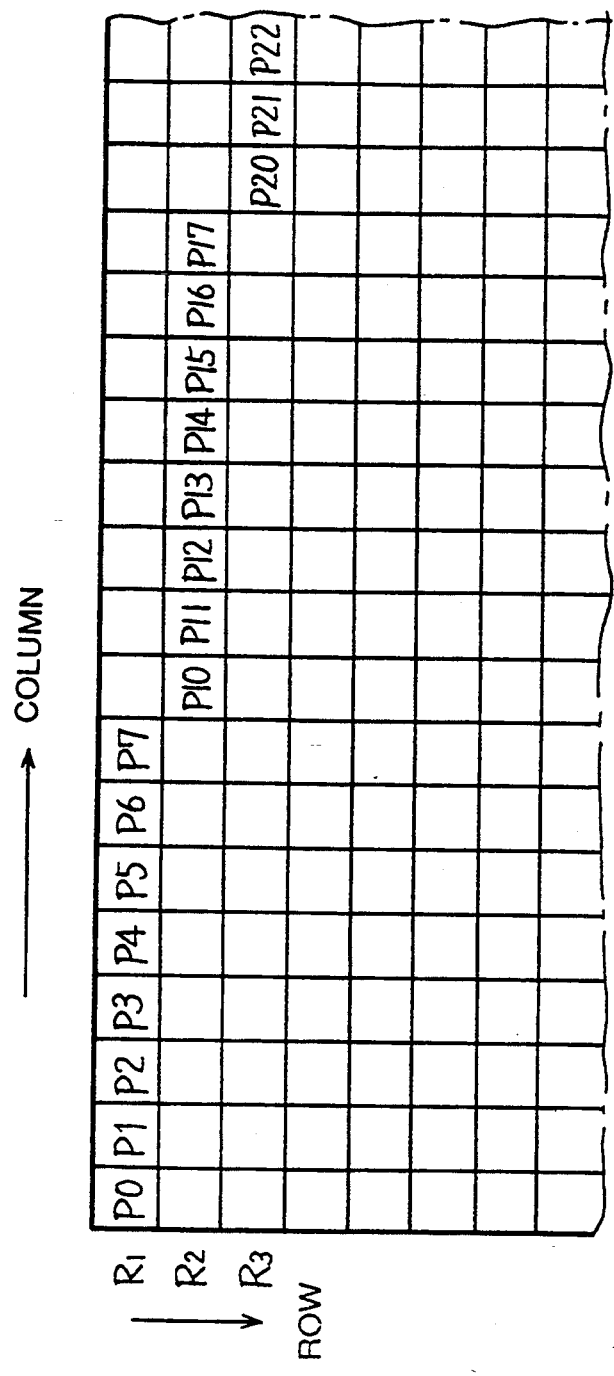
FIG. 15 is a memory matrix diagram for explaining a concept of the oblique reading in the video RAM.
Figure 16:
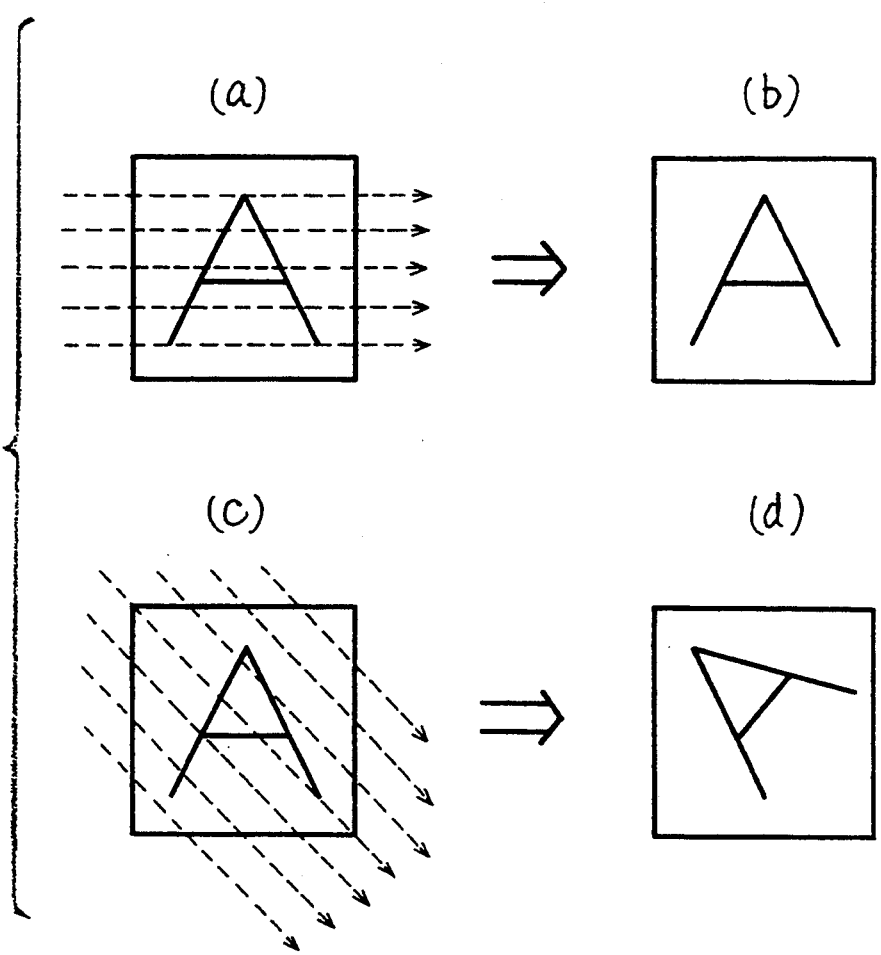
FIGS. 16(a)-(d) are a concept diagram for explaining an ordinary horizontal reading and the oblique reading.

Description will now be given of an oblique reading operation in the video RAM 300 shown in FIG. 1. In the following description, the oblique reading shown in FIG. 15, that is, an example where eight data signals are read out for each row will be described.

Figure 4:
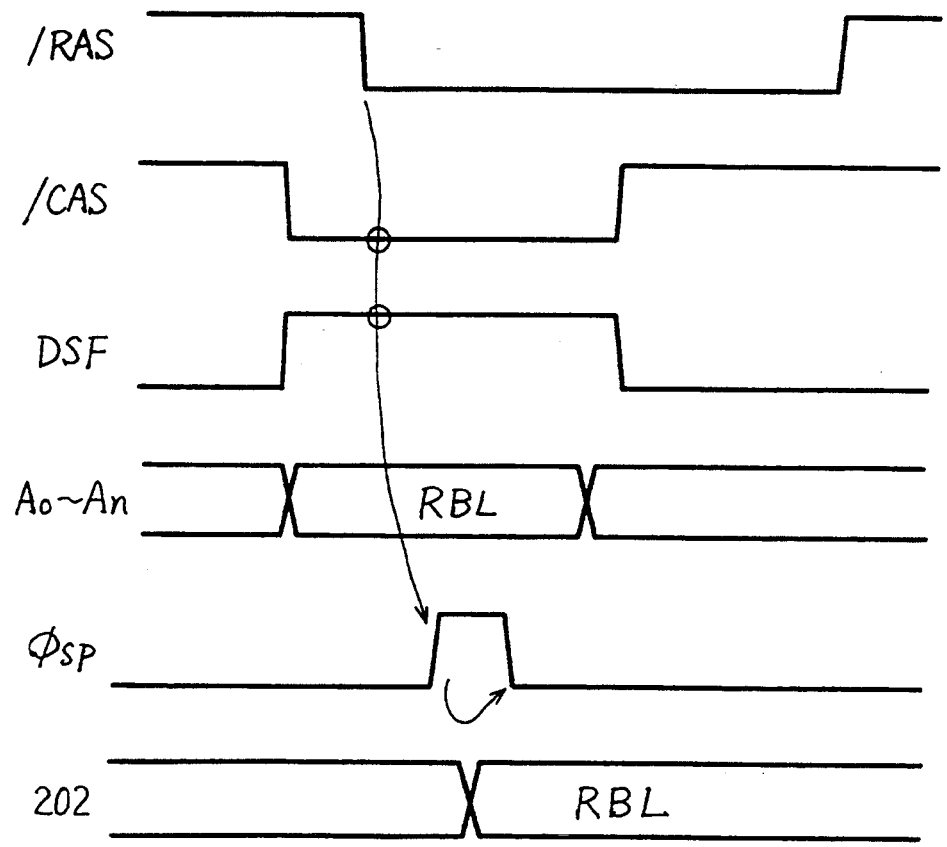
FIG. 4 is a timing chart of a read bit length setting mode in the video RAM shown in FIG. 1.

FIG. 4 is a timing chart of a read bit length setting mode in the video RAM 300 shown in FIG. 1. Read bit length of one row in the oblique reading is first set in the video RAM 300. Referring to FIG. 4, after the signal /CAS falls, the signal /RAS also falls. Since the externally applied signal DSF is at a high level at this time, the read bit length setting mode is initiated. At this time, externally applied address signals A0 to An include data RBL defining the read bit length. The data RBL is applied to the counter circuit 200 through the column address buffer 4b.

Since the switching circuit 201 shown in FIG. 3 is turned on in response to the signal Φsp applied from the timing control circuit 41, the read bit length data RBL is latched in the latch circuit 202. The latched data RBL determines bit length of one row in the oblique reading as will be described later.

Figure 5:
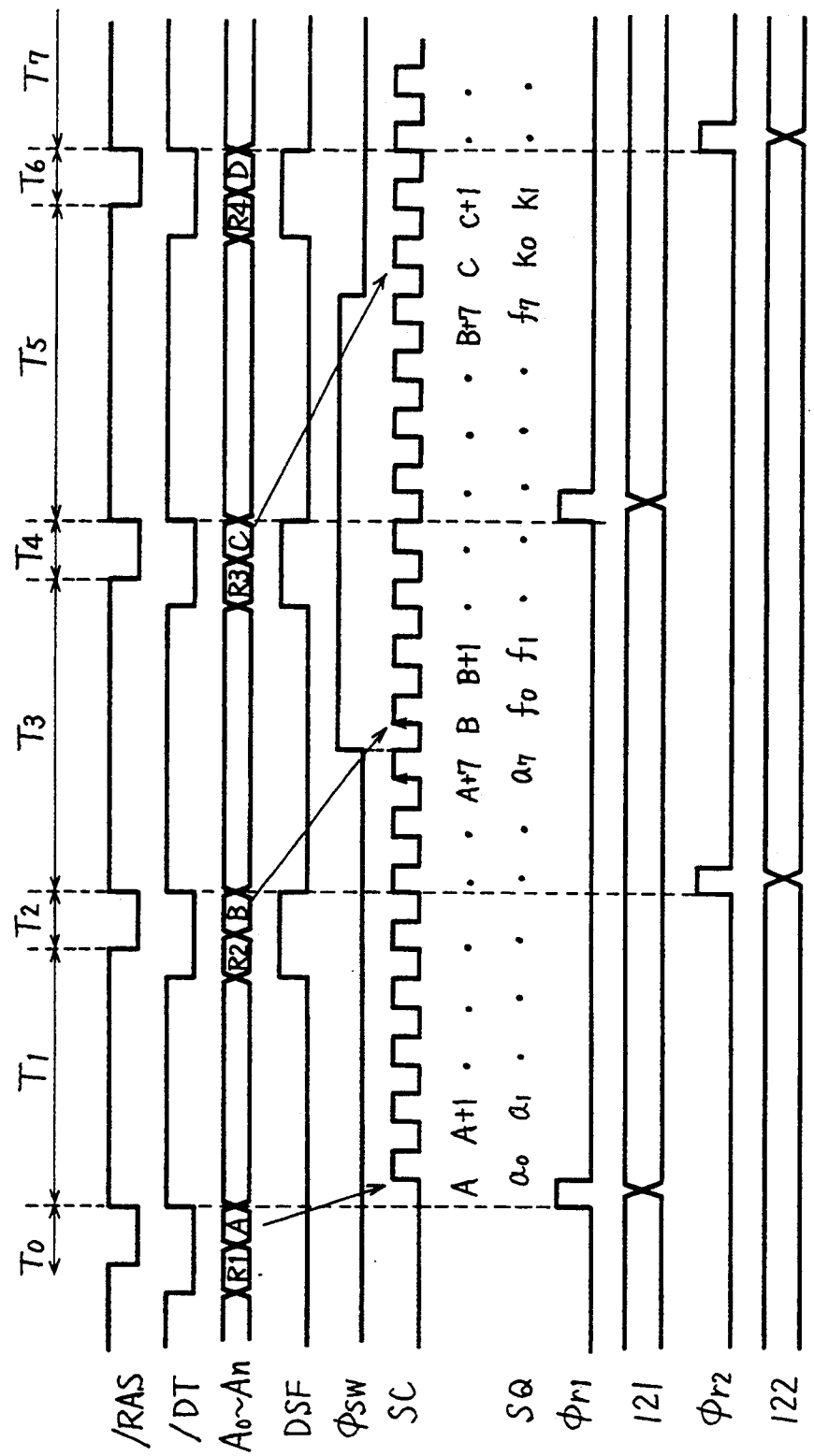
FIG. 5 is a timing chart for explaining operations of a special transfer mode in the video RAM shown in FIG. 1.

FIG. 5 is a timing chart for explaining operations in the special transfer mode in the video RAM 300 shown in FIG. 1. First, at a period T0, because of a normal transfer operation, data stored in the row R1 in the memory cell array 1 is transferred to the data register 121. Simultaneously, an initial address A (which is included in the externally applied address signals A0 to An) for the serial reading is applied to the serial counter 100 through the column address buffer 4b.

At a period T1, the serial selector 13 sequentially selects the Ath data and et seq. in the data register 121 in response to the serial clock signal SC. Therefore, data a0 to a7 (data length (=8) of which is determined by the aforementioned data RBL) stored in the data register 121 are sequentially provided. In this period T1, since the switching control signal Φsw is at a low level, the output signal line 81 of the data register 121 is connected to the preamplifier 14a through the switching circuit 19. Therefore, stored pixel signals a0 to a7 are provided outside as output data SQ.

At a period T2, the special transfer mode is initiated. In the period T2, the row address signal R2 is applied externally, and the data stored in the row R2 is transferred to the data register 122. In addition to this, in this period T2, the next initial address B is applied at the timing of a column address signal, and data B is applied to the TAP latch circuit 102 shown in FIG. 3.

After eight pixel signals a0 to a7 in total are provided, the counter 205 shown in FIG. 3 provides a carry signal as a switching control signal Φsw. In other words, the counter 205 provides a carry signal Φsw after counting the applied data RBL (=8). The switching circuit 19 connects the output signal line 82 of the data register 122 to the preamplifier 14a in response to the signal Φsw. Therefore, from the middle of a period T3, eight data f0 to f7 of the Bth data and et seq. stored in a new row R2 are sequentially provided.

By repeating the above-described operations sequentially, the oblique reading in the video RAM 300 is carried out. Periods T2, T4 and T6 shown in FIG. 5 respectively denote special transfer mode periods. The other periods T1, T3, T5 and T7 denote serial output periods of data, and it is pointed out that reading and writing with a random access port can be carried out in these periods.

Figure 6:
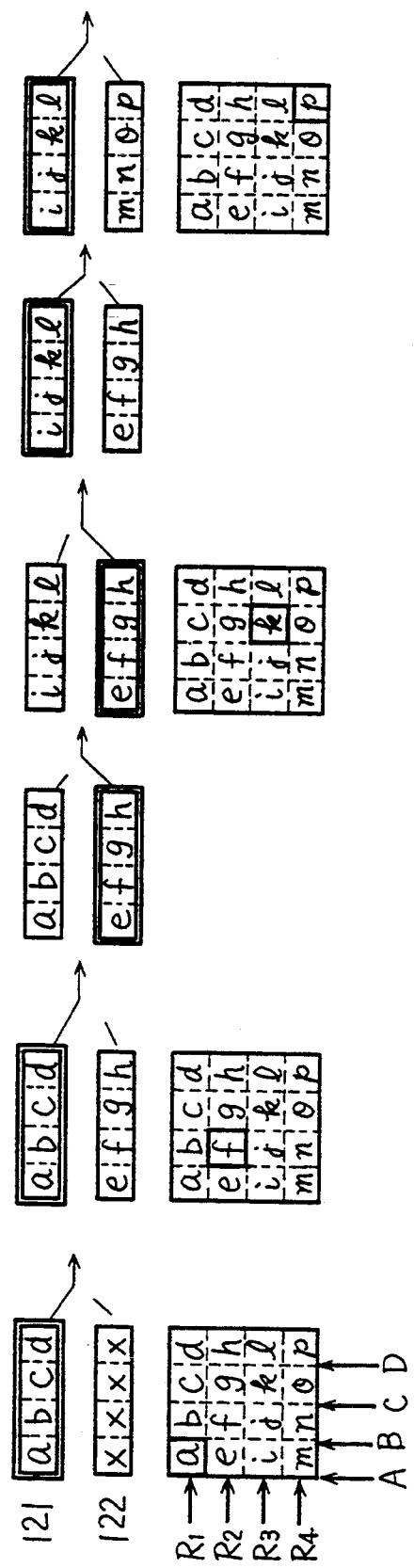
FIG. 6 is a concept diagram for explaining the oblique reading in the video RAM shown in FIG. 1.

FIG. 6 is a concept diagram for explaining the oblique reading in the video RAM 300 shown in FIG. 1. Referring to FIG. 6, the memory matrix is provided with four rows R1 to R4 for simplicity of description. Each of the rows R1 to R4 includes four data regions. For example, the one row R1 includes four data regions a to d. Each data region, for example, the data region a can store eight pixel signals a0 to a7.

The data registers 121 and 122 hold data of one row. In each period, the data is sequentially provided from the data register 121 or 122 surrounded by a double line. Therefore, because of the oblique reading function, data in the memory matrix is read out in the order of the data regions a, f, k, p. Symbols A, B, C, D denote positions of the initial addresses of each data region in the memory matrix.

Figure 7:
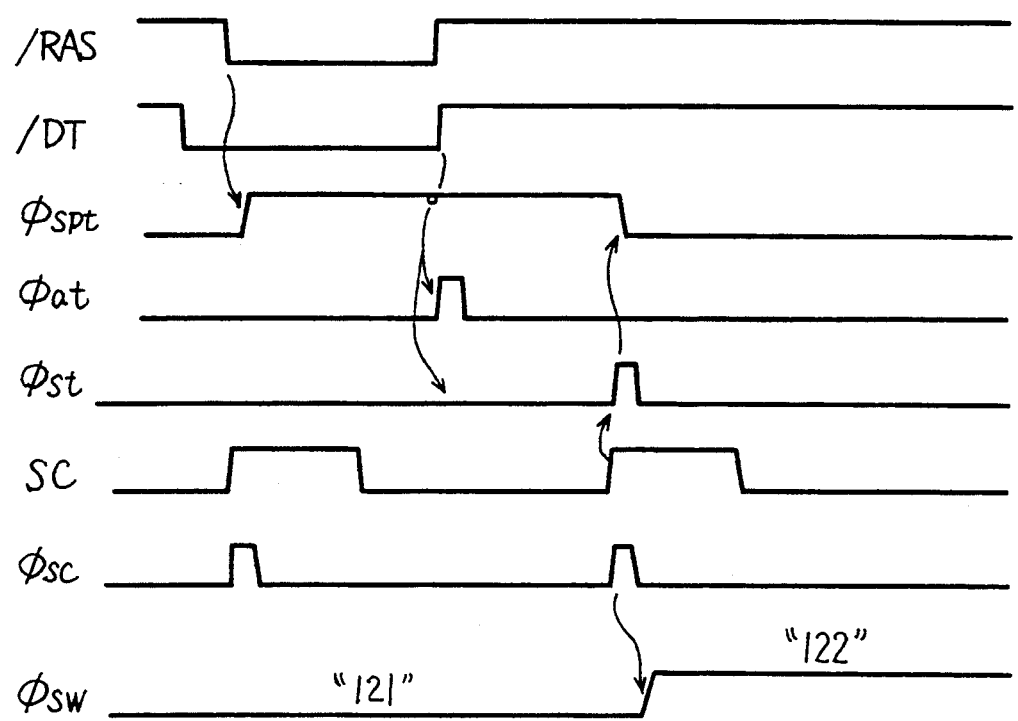
FIG. 7 is a timing chart for explaining operations in the special transfer mode of the counter circuits 100 and 200 shown in FIG. 3.

FIG. 7 is a timing chart for explaining operations in the special transfer mode of the counter circuits 100 and 200 shown in FIG. 3. In the special transfer mode, an internal signal Φspt indicating initiation of the special transfer mode is activated. At this time, since the signal Φst is at a low level, one pulse signal Φat is provided. Therefore, the initial address included in externally applied column address signals is applied to the TAP latch circuit 102 in the serial counter circuit 100.

On the other hand, in response to the serial clock signal SC, the timing control circuit 41 provides the clock signal Φsc for driving the counters 104 and 205. The serial counter 104 and the counter 205 are driven in response to the signal Φsc, thereby continuing counting operations to respective predetermined count values.

Because of the counting operation of the counter 205, the carry signal is applied to the switching circuit 19 as the switching control signal Φsw. After change of the switching control signal Φsw, the special transfer mode is terminated, and the internal signal Φspt is reset.

As can be seen from FIG. 5, no problem is caused if the special transfer cycle is carried out in a period when eight data, for example, a0 to a7 are provided sequentially. Therefore, synchronization with the serial clock signal SC is not required, thereby facilitating timing control of the externally applied signals /RAS and /DT.

Figure 8:
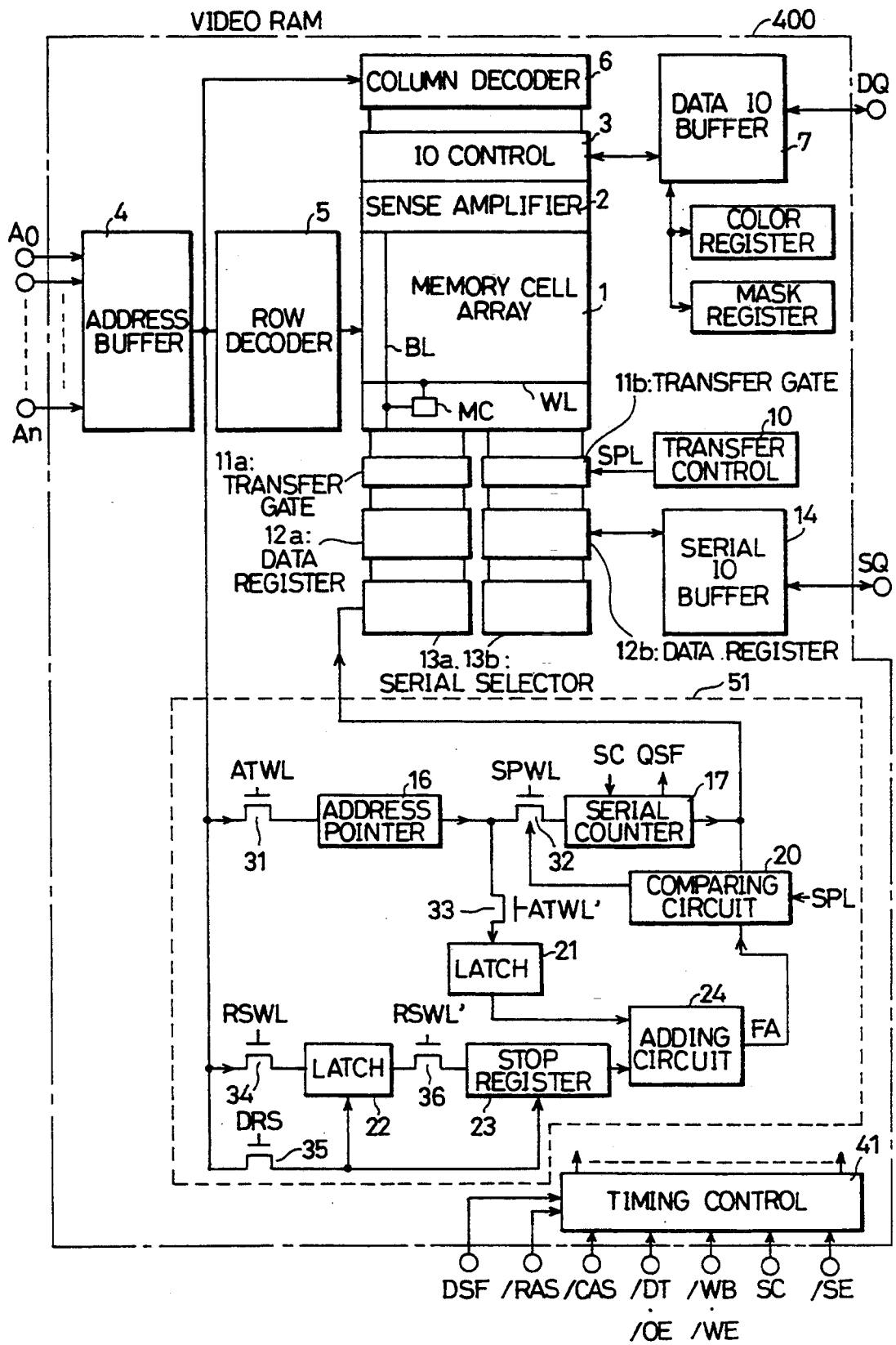
FIG. 8 is a block diagram of the video RAM showing another embodiment of the present invention.
Figure 17:
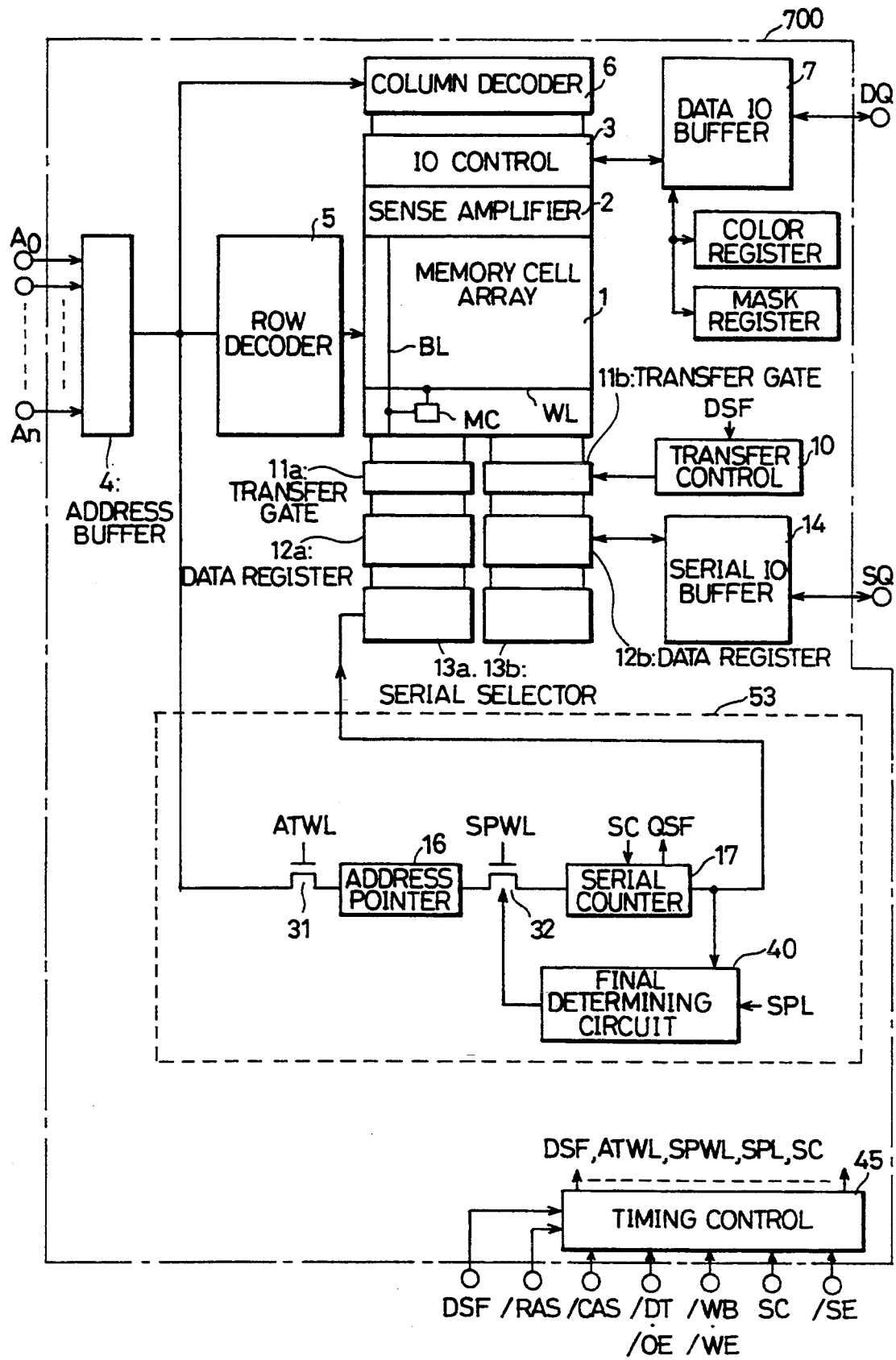
FIG. 17 is a block diagram of another video RAM showing the background of the present invention.
Figure 18:
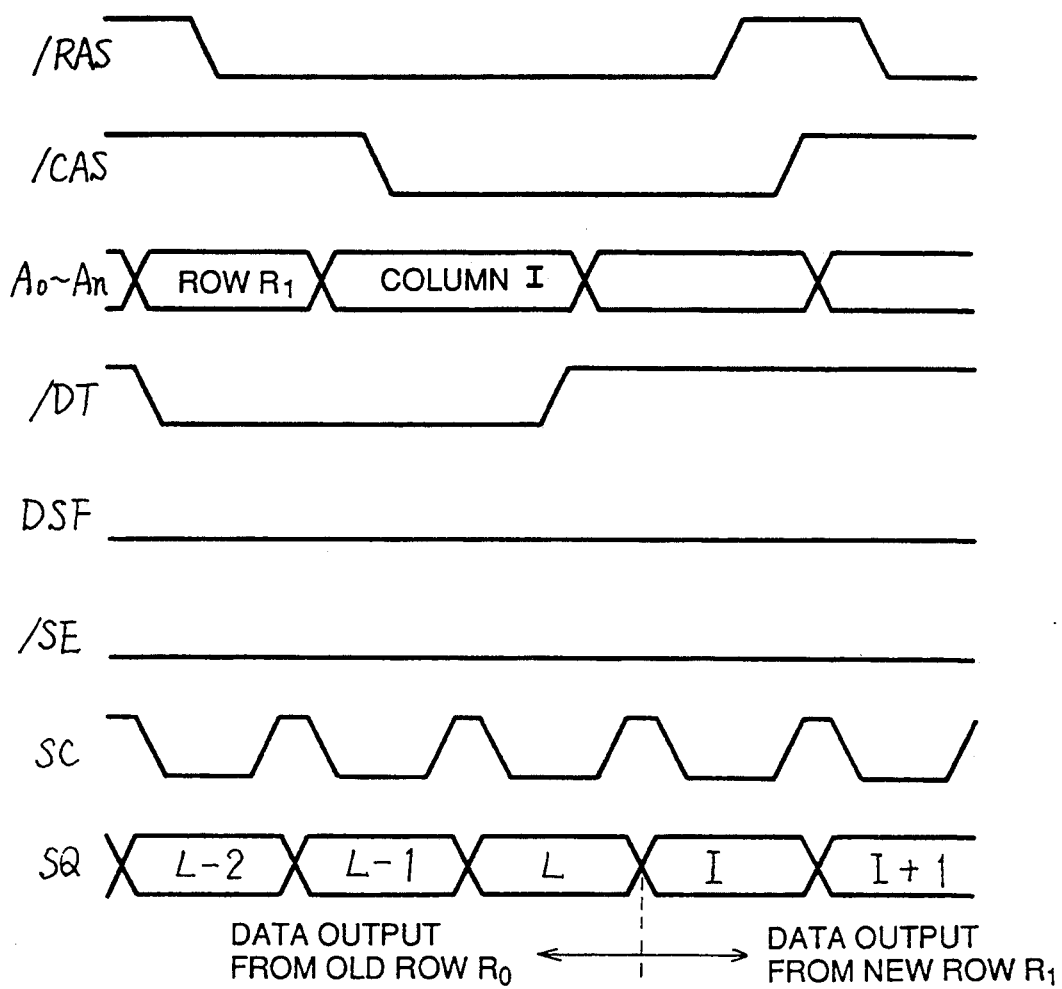
FIG. 18 is a timing chart for explaining operations in a transfer cycle of the video RAM shown in FIG. 17.
Figure 19:
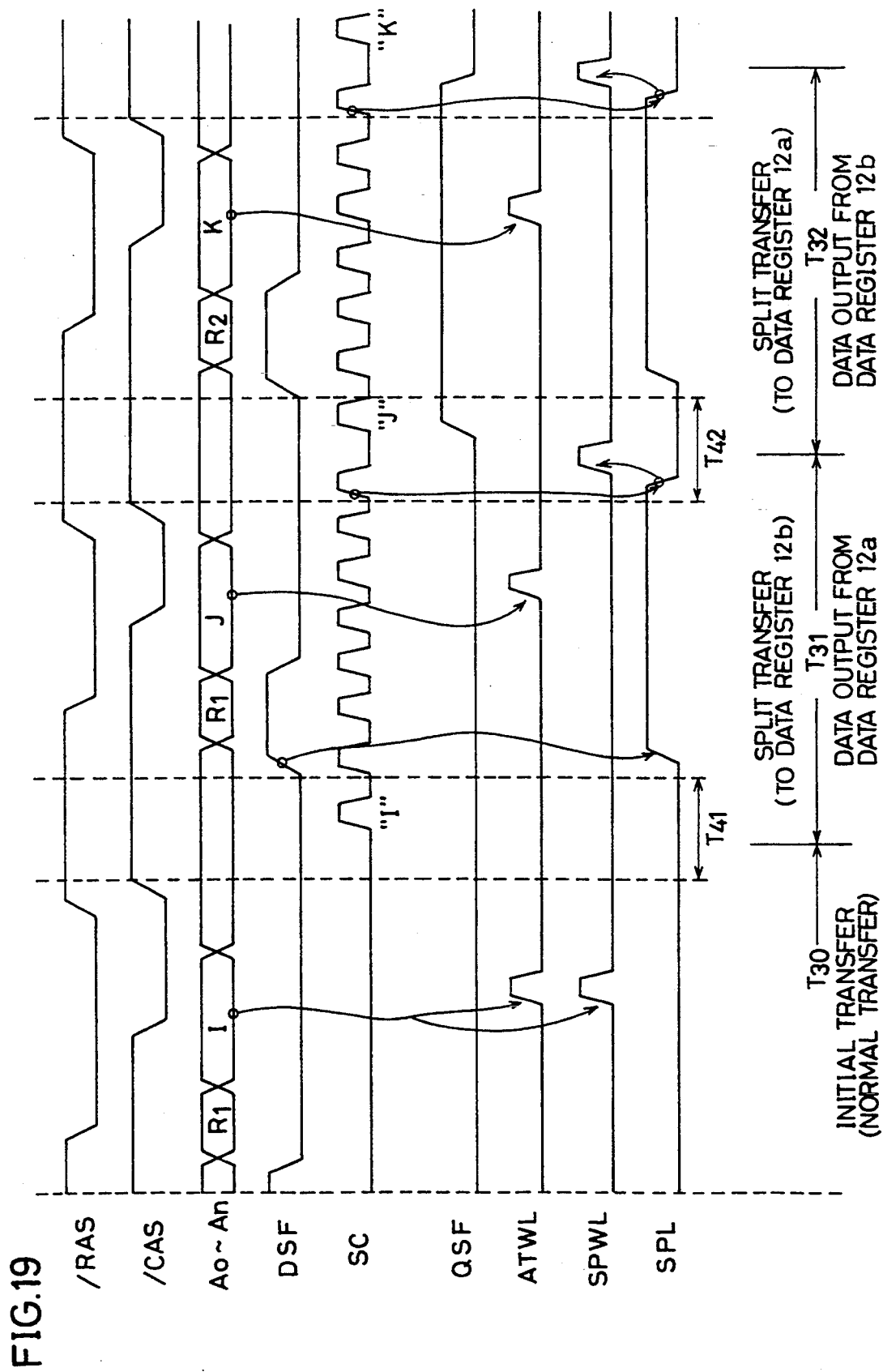
FIG. 19 is a timing chart for explaining operations in the split function of the video RAM shown in FIG. 17.

FIG. 8 is a block diagram of a video RAM showing another embodiment of the present invention. Referring to FIG. 8, a video RAM 400 includes, as compared to the video RAM 700 shown in FIG. 17, an improved serial selector control circuit 51, and an improved timing control circuit 41 for generating a timing signal for controlling the serial selector control circuit 51. Since the other circuit configuration is similar to that of the video RAM 700 shown in FIG. 17, description will not be repeated.

The serial selector control circuit 51 includes the address pointer 16, the serial counter 17, a comparing circuit 20, latch circuits 21 and 22, a stop register 23, an adding circuit 24, and switching circuits 31 to 36. The switching circuits 31 to 36 are respectively controlled in response to switching control signals ATWL, SPWL, ATWL', RSWL, DRS, and RSWL' generated from the timing control circuit 41.

Figure 9:
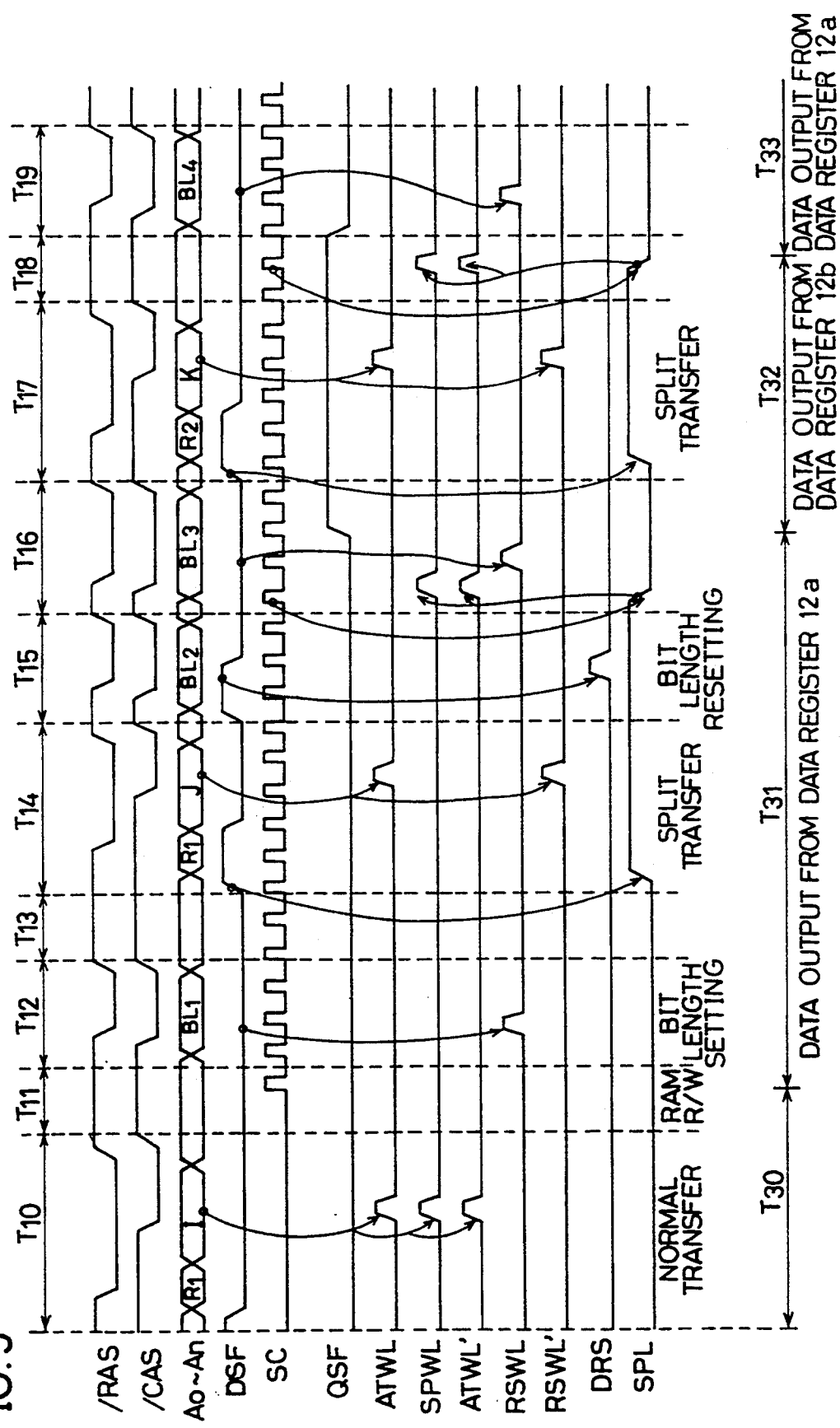
FIG. 9 is a timing chart for explaining operations in a split function of the video RAM shown in FIG. 8.

FIG. 9 is a timing chart for explaining operations in the split function of the video RAM 400 shown in FIG. 8. Referring to FIGS. 8 and 9, operations of the video RAM 400 will be described.

In a period T10, a normal transfer mode is carried out as initial transfer. More specifically, in this period T10, a column address signal indicating the initial address I is applied to the address buffer 4, and the initial address I is transferred to the address pointer 16, the serial counter 17 and the latch circuit 21 in response to the switching control signals ATWL, SPWL, ATWL', respectively.

In a period T12, a final address setting operation is carried out. In this period T12, address signals A0 to An including data BL1 defining bit length for the initial serial reading are applied to the address buffer 4. In addition to this, the switching circuit 34 is turned on in response to the signal RSWL, and the bit length data BL1 is latched in the latch circuit 22.

In a period T14, the split transfer is carried out. In this period T14, in response to the rise of the externally applied signal DSF, the timing control circuit 41 causes the signal SPL to rise. In response to the high level signal SPL, one of the transfer gate circuits 11a and 11b is turned on, and the former or the latter half of the data stored in one row of the memory cell array 1 is selectively provided to the data register 12a or 12b.

In addition to this, in this period T14, address signals A0 to An including an initial address J are applied to the address buffer 4. Since the switching circuit 31 is turned on response to the signal ATWL, the initial address J is applied to the address pointer 16. Simultaneously, the switching circuit 36 applies data latched in the latch circuit 22, that is, the bit length data BL1, to the stop register 23 in response to the signal RSWL'. Therefore, the initial address I latched in the latch circuit 21 and the bit length data BL1 in the stop register 23 are added by the adding circuit 24, whereby a final address data FA is provided. The final address data FA is applied to the comparing circuit 20 to be stored therein.

If it is necessary to change data held in the stop register 23, the following operation is carried out. In a period T15, the signal DRS rises, causing the switching circuit 35 to be turned on. Therefore, a bit length data BL2 applied to the address buffer 4 in this period is applied through the switching circuit 35 to the latch circuit 22 and the stop register 23, respectively, to be held therein. The adding circuit 24 adds data stored in the latch circuit 21 and data stored in the stop register 23. Data obtained by addition, that is, the serial address, must be chosen to be a value smaller than the finally determined total number of bits.

The comparing circuit 20 compares data provided from the serial counter 17, that is, serial increase data, with a final address applied from the adding circuit 24. When the serial increase data matches the final address FA, the signal SPL is reset. More specifically, in a period T16, in response to reset of the signal SPL, the signals SPWL and ATWL' rise, causing the switching circuits 32 and 33 to be turned on. In other words, the content of the serial counter 17 and the content of the latch circuit 21 are rewritten by the data stored in the address pointer 16, that is, the next initial address J. The serial counter 17 initiates the counting operation from the new initial address J in response to the signal SC. The adding circuit 24 adds the new initial address latched in the latch circuit 21 and a bit length data stored in the stop register 23, providing the new final address FA to the comparing circuit 20. The counting operation by the serial counter 17 is continued as mentioned before until a match is detected in the comparing circuit 20, and the serial increase data is applied to the serial selectors 13a and 13b.

Figure 10:
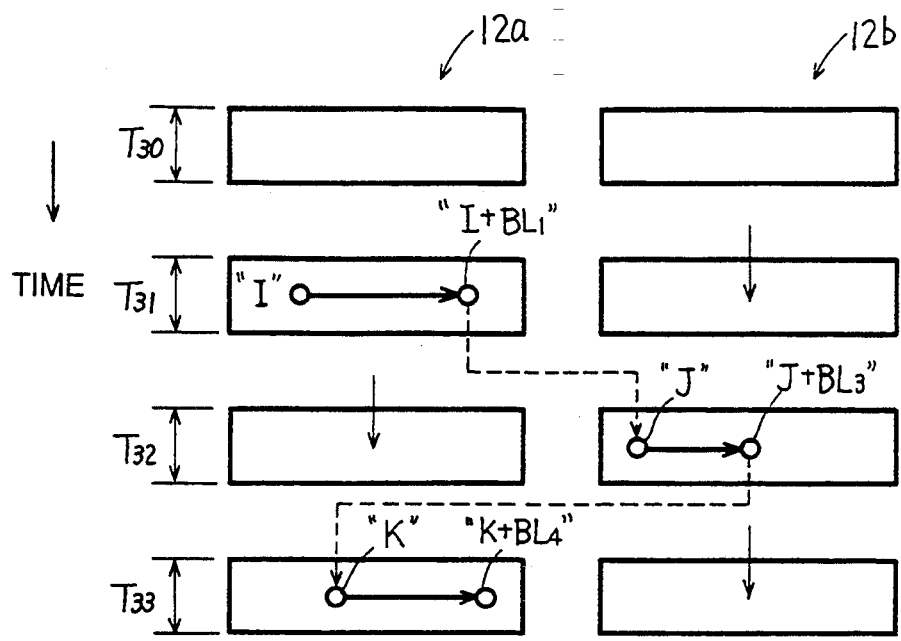
FIG. 10 is a concept diagram for explaining input/output of a data register in a split transfer shown in FIG. 9.

FIG. 10 is a concept diagram showing input/output of the data registers 12a and 12b in the split transfer shown in FIG. 9. Periods T30 to T33 shown in FIG. 10 correspond to the periods T30 to T33 shown in FIG. 11. Referring to FIG. 10, in the period T30, the normal transfer mode is carried out (which corresponds to the period T10 shown in FIG. 9). In the period T31, the Ith to (I+BL1)th data of the data stored in the data register 12a are provided.

In the period T32, the Jth to (J+BL3)th data of the data stored in the data register 12b are provided. In the period T33, the Kth to (K+BL4)th data of the data stored in the data register 12a are provided.

Figure 11:
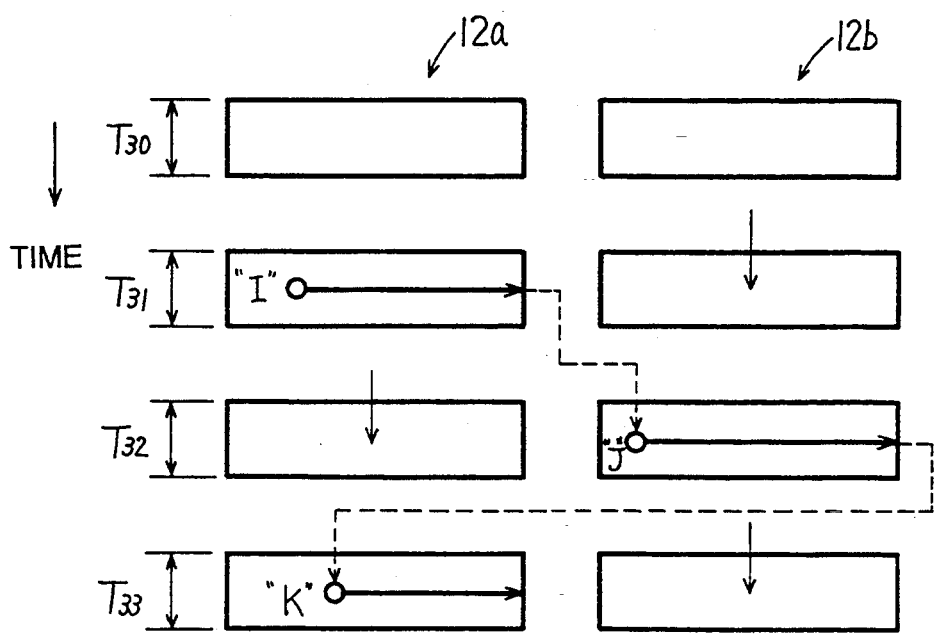
FIG. 11 is a concept diagram for explaining input/output of the data register in the split transfer shown in FIG. 9.

As can be seen from comparison of FIG. 10 with FIG. 11, in the video RAM 400 shown in FIG. 8 the final data of the data provided from each of the data registers 12a and 12b can be controlled. In other words, by externally applying bit length data BL1, BL3, BL4 and the like externally, it is possible to provide only necessary data from each of the data registers 12a and 12b. Conversely, as shown in FIG. 11, in the video RAM.700 shown in FIG. 17 all the data stored in each of the data registers 12a and 12b were provided regardless of necessity of the output data. Therefore, by using the video RAM 400 shown in FIG. 8, consumption of access time for providing unnecessary data can be prevented.

Figure 12:
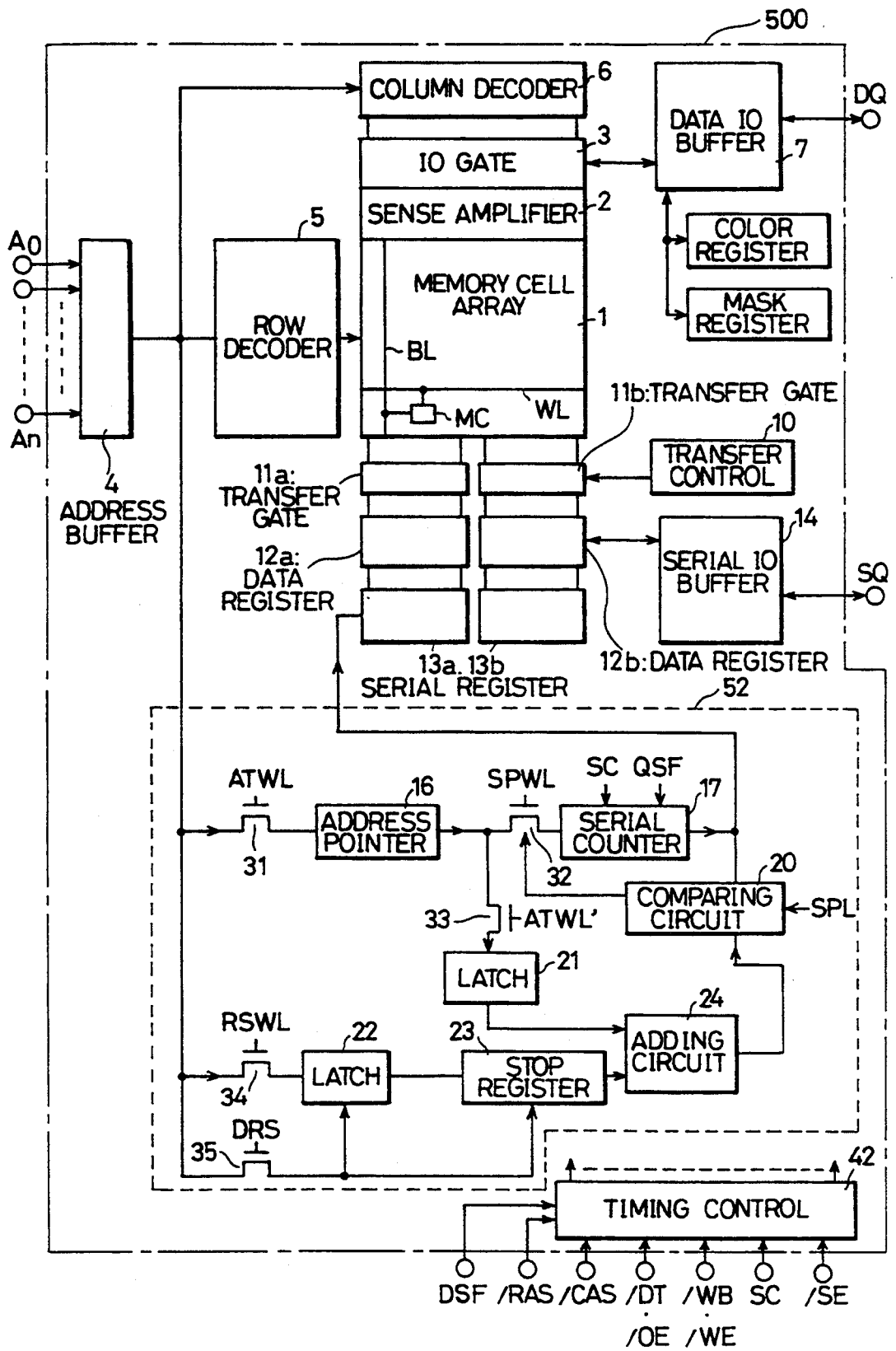
FIG. 12 is a block diagram of the video RAM showing still another embodiment of the present invention.

FIG. 12 is a block diagram of a video RAM showing still another embodiment of the present invention. Referring to FIG. 12, a video RAM 500, as compared to the video RAM 400 shown in FIG. 8, omits the switching circuit 36 shown in FIG. 8 from the serial selector control circuit 52. Since the other circuit configuration is similar to that of the video RAM 400 shown in FIG. 8, and the operations are similar, description will not be repeated.

Omission of the switching circuit 36 shown in FIG. 8 makes it difficult to control timings of the control signals in the bit length setting periods (for example, periods T12, T16 and the like shown in FIG. 9). However, the video RAM 500 can bring the advantages similar to those of the video RAM 400 shown in FIG. 8.

As described above, the video RAM 300 shown in FIG. 1 is provided with the data registers 121 and 122 which can alternately transfer and store data of each row in the memory cell array 1. Therefore, even if a complicated data reading such as the oblique reading is required, the timing control of the control signals such as externally applied signals /DT and SC can be simplified. As a result, a video RAM useful in the video signal processing where a high speed data reading is required can be obtained.

Figure 20:
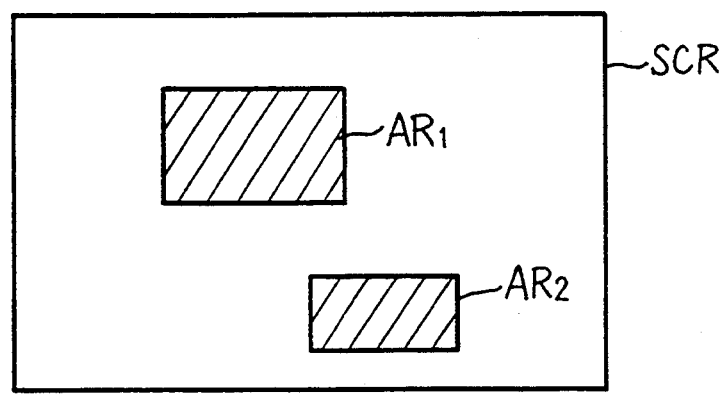
FIG. 20 is a concept diagram for explaining a pixel data area on a screen of the video RAM shown in FIG. 8.
Figure 21:
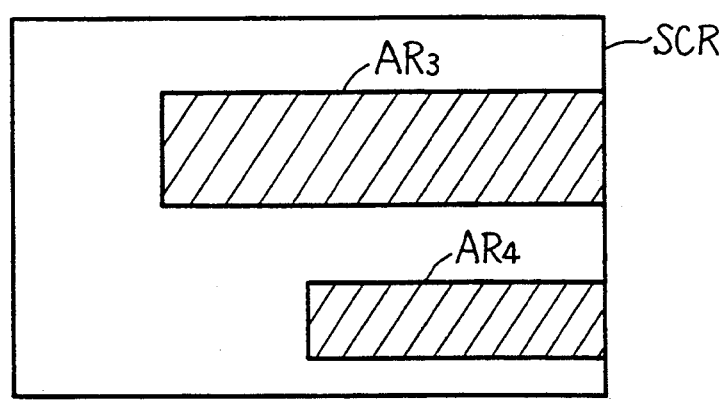
FIG. 21 is a concept diagram for explaining the pixel data area on the screen of the video RAM shown in FIG. 17.

On the other hand, as can be seen from FIG. 10, since the final data read out from each of the data registers 12a and 12b can be designated in the video RAMs 400 and 500 shown in FIGS. 8 and 12, it is possible to provide only necessary data outside. In other words, for example in video indication, when pixel data in the areas AR1 and AR2 shown in FIG. 20, is required, all the data in areas AR3 and AR4 shown in FIG. 21 is prevented from being provided, that is, only desired data can be provided outside. Therefore, it is possible to prevent consumption of access time for providing unnecessary data, whereby a high speed operation required in, for example, video signal processing can be accomplished.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array having a plurality of memory cells arranged in rows and columns;
   first and second data holding means each for holding data stored in one row of said memory cell array;
   alternate data transfer means for alternately transferring data stored in the rows of said memory cell array to said first and second data holding means in response to an externally applied state control signal; and
   alternate data output means for alternately providing respective blocks of data held in said first and second data holding means in response to an externally applied serial clock signal;
   wherein said alternate data output means comprises
      first counter means for counting the serial clock signal up to an externally applied data length value to provide a switching control signal, and
      selector circuit means for selectively providing data held in said first and second data holding means in response to the switching control signal.

2. A semiconductor memory device, comprising:
   a memory cell array having a plurality of memory cells arranged in rows and columns;
   first and second data holding means each for holding data stored in one row of said memory cell array;
   alternate data transfer means for alternately transferring data stored in the rows of said memory cell array to said first and second data holding means in response to an externally applied state control signal; and
   alternate data output means for alternately providing respective blocks of data held in said first and second data holding means in response to an externally applied serial clock signal;
   further comprising partial data selecting means for partially selecting data held in said first and second data holding means;
   wherein said partial data selecting means comprises
      second counter means for counting the serial clock signal from an externally applied initial address to generate addresses of said first and second data holding means, and
      serial selector means for serially selecting data in said first and second data holding means in response to the addresses generated from said second counter means.

3. A semiconductor memory device, comprising:
   a memory cell array having a plurality of memory cells arranged in rows and columns;
   first and second data holding means each for holding data stored in one row of said memory cell array;
   alternate data transfer means for alternately transferring data stored in the rows of said memory cell array to said first and second data holding means in response to an externally applied state control signal; and
   alternate data output means for alternately providing respective blocks of data held in said first and second data holding means in response to an externally applied serial clock signal;
   further comprising partial data selecting means for partially selecting data held in said first and second data holding means;
   wherein said partial data selecting means further comprises initial address holding means for holding said externally applied initial address,
   said initial address holding means holds the next initial address when said second counter means counts the serial clock signal from the previous initial address held in said initial address holding means.

4. A semiconductor memory device, comprising:
   a memory cell array having a plurality of memory cells arranged in rows and columns;
   data holding means for holding data stored in one row of said memory cell array in response to an externally applied state control signal;
   initial address holding means for holding an externally applied initial address;
   end address holding means for holding an externally applied end address; and
   serial data output means for serially providing data designated by said initial and end addresses from said data holding means in response to an externally applied serial clock signal.

5. The semiconductor memory device according to claim 4, further comprising
   data length holding means for holding an externally applied data length value, and
   adding means for adding data held in said initial address holding means and said data length holding means, wherein
   said end address holding means holds data provided from said adding means as said end address.

6. The semiconductor memory device according to claim 5, wherein said data output means comprises
   counter means for counting an externally applied serial clock signal from said initial address,
   comparator means for comparing output data of said counter means with said end address, and
   transfer means for transferring a new initial address held in said initial address holding means to said counter means in response to an output signal from said comparator means.

7. The semiconductor memory device according to claim 4, wherein said data holding means comprises
   first data holding means for holding one half of the data stored in one row of said memory cell array in response to the externally applied state control signal, and
   second data holding means for holding the other half of the data stored in said one row of said memory cell array in response to the externally applied state control signal, wherein
   said serial data output means includes alternate data outputs means for alternately providing data designated by said initial and end addresses from said first and second data holding means in response to the externally applied serial clock signal.

8. The semiconductor memory device according to claim 7, further comprising alternate data transfer means for alternately transferring, one-half and the other half respectively, of the data stored in one row of said memory cell array to said first and second data holding means.

9. The semiconductor memory device according to claim 4, wherein
   said semiconductor memory device is a video random access memory having a split function.

10. A semiconductor memory device, comprising:

a memory cell array having a plurality of memory cells arranged in rows and columns;

first and second data holding means each for holding data stored in one row of said memory cell array;

alternate data transfer means for alternately transferring data stored in the rows of said memory cell array to said first and second data holding means in response to an externally applied state control signal;

alternate data output means for alternatively providing respective blocks of data held in said first and second data holding means in response to an externally applied serial clock signal, said alternate data output means comprising:
first counter means for counting the serial clock signal up to an externally applied data length value to provide a switching control signal, and
selector circuit means for selectively providing data held in said first and second data holding means in responsive to the switching control signal.

11. The semiconductor memory device according to claim 10, wherein
said alternate data output means further comprises data length storing means for storing said externally applied data length value to provide the stored data to said first counter means.

12. A semiconductor memory device, comprising:
a memory cell array having a plurality of memory cells arranged in rows and columns;

first and second data holding means each for holding data stored in one row of said memory cell array;

alternate data transfer means for alternately transferring data stored in the rows of said memory cell array to said first and second data holding means in response to an externally applied state control signal;

alternate data output means for alternatively providing respective blocks of data held in said first and second data holding means in response to an externally applied serial clock signal, partial data selecting means for partially selecting data held in said first and second data holding means, said partial data selecting means comprising:
second counter means for counting the serial clock signal from an externally applied initial address to generate addresses of said first and second data holding means; and
serial selector means for serially selecting data in said first and second data holding means in response to the addressees generated from said second counter means.

13. A semiconductor memory device, comprising:
a memory cell array having a plurality of memory cells arranged in rows and columns;

first and second data holding means each for holding data stored in one row of said memory cell array;

alternate data transfer means for alternately transferring data stored in the rows of said memory cell array to said first and second data holding means in response to an externally applied state control signal;

alternate data output means for alternatively providing respective blocks of data held in said first and second data holding means in response to an externally applied serial clock signal, partial data selecting means for partially selecting data held in said first and second data holding means, said partial data selecting means comprising:
said partial data selecting means further comprises initial address holding means for holding said externally applied initial address,
said initial address holding means holds the next initial address when said second counter means counts the serial clock signal from the previous initial address held in said initial address holding means.

* * * * *